(12) United States Patent
Do et al.

(10) Patent No.: US 8,178,956 B2
(45) Date of Patent: May 15, 2012

(54) INTEGRATED CIRCUIT PACKAGE SYSTEM FOR SHIELDING ELECTROMAGNETIC INTERFERENCE

(75) Inventors: Byung Tai Do, Singapore (SG); Heap Hoe Kuan, Singapore (SG); Rui Huang, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 561 days.

(21) Appl. No.: 11/956,132

(22) Filed: Dec. 13, 2007

(65) Prior Publication Data

US 2009/0152688 A1 Jun. 18, 2009

(51) Int. Cl.
*H01L 23/495* (2006.01)

(52) U.S. Cl. ............... 257/676; 257/E23.114; 257/659; 257/660; 438/123

(58) Field of Classification Search ........... 257/E21.505, 257/E21.506, E23.114, 659, 675, 676, 660, 257/704, 706, 787, 796, 670, 707; 438/119, 438/122, 127, 123
See application file for complete search history.

(56) References Cited

U.S. PATENT DOCUMENTS

| | | | | |
|---|---|---|---|---|
| 4,801,998 A * | 1/1989 | Okuaki | ......................... | 257/681 |
| 5,473,512 A * | 12/1995 | Degani et al. | .................. | 361/760 |
| 5,552,635 A * | 9/1996 | Kim et al. | ..................... | 257/706 |
| 5,977,626 A * | 11/1999 | Wang et al. | .................... | 257/707 |
| 6,246,115 B1 * | 6/2001 | Tang et al. | ..................... | 257/706 |
| 6,432,742 B1 * | 8/2002 | Guan et al. | ..................... | 438/106 |
| 6,512,675 B1 * | 1/2003 | Tarter et al. | .................... | 361/714 |
| 6,552,428 B1 * | 4/2003 | Huang et al. | ................... | 257/706 |
| 6,707,168 B1 * | 3/2004 | Hoffman et al. | ............... | 257/796 |
| 6,919,631 B1 | 7/2005 | Hoffman et al. | | |
| 7,030,469 B2 | 4/2006 | Mahadevan et al. | | |
| 7,075,183 B2 * | 7/2006 | Soga et al. | ..................... | 257/772 |
| 7,109,410 B2 | 9/2006 | Arnold et al. | | |
| 7,187,060 B2 * | 3/2007 | Usui | ............................. | 257/659 |
| 7,196,415 B2 * | 3/2007 | Zhong et al. | ................... | 257/712 |
| 7,198,987 B1 | 4/2007 | Warren et al. | | |
| 7,254,032 B1 | 8/2007 | Xue et al. | | |
| 7,259,445 B2 * | 8/2007 | Lau et al. | ....................... | 257/675 |
| 7,312,525 B2 * | 12/2007 | Tatt et al. | ...................... | 257/704 |
| 7,352,052 B2 * | 4/2008 | Imoto et al. | .................... | 257/622 |
| 7,425,755 B2 * | 9/2008 | Liu | ................................. | 257/666 |
| 7,468,548 B2 * | 12/2008 | Wu et al. | ........................ | 257/675 |
| 7,482,686 B2 * | 1/2009 | Zhao et al. | ..................... | 257/710 |
| 7,518,201 B2 | 4/2009 | Stelzl et al. | .................... | 257/416 |
| 7,545,032 B2 * | 6/2009 | Bathan et al. | .................. | 257/690 |
| 7,566,590 B2 * | 7/2009 | Zhong et al. | ................... | 438/119 |
| 7,576,415 B2 * | 8/2009 | Cha et al. | ...................... | 257/659 |
| 7,629,674 B1 * | 12/2009 | Foster | ............................ | 257/659 |
| 2005/0280127 A1 * | 12/2005 | Zhao et al. | ..................... | 257/678 |

* cited by examiner

*Primary Examiner* — Chris Chu
(74) *Attorney, Agent, or Firm* — Ishimaru & Associates LLP; Mikio Ishimaru; Stanley Chang (57) ABSTRACT

An integrated circuit package system includes: providing a substrate; coupling an integrated circuit to the substrate; mounting a shielding element around the integrated circuit; applying a conductive shielding layer on the shielding element; and coupling a system interconnect to the shielding element.

20 Claims, 5 Drawing Sheets

INTEGRATED CIRCUIT PACKAGE SYSTEM FOR SHIELDING ELECTROMAGNETIC INTERFERENCE

TECHNICAL FIELD

The present invention relates generally to integrated circuit packaging, and more particularly to a system for packaging an integrated circuit with a shield for electromagnetic interference.

BACKGROUND ART

Portable electronic devices, such as cell phones, typically utilize multi-component semiconductor modules to provide a high level of circuit integration in a single molded package. The multi-component semiconductor module can include, for example, a semiconductor die and a number of electronic components, which are mounted on a substrate. The substrate including the semiconductor die and electronic components can be encapsulated in a molding process to form an over-molded semiconductor package.

To ensure an acceptable level of performance in devices such as cell phones, which are required to properly operate in diverse environments, the over-molded semiconductor package must be shielded from Electromagnetic Interference (EMI) and/or Radio Frequency Interference (RFI). Semiconductor die may emit electromagnetic radiation, generally in the range of 50 MHz to 3 GHz, depending on the speed of the digital functions. As can be appreciated, with the advances in high-speed digital design and the rapidly increasing capabilities of high-speed networking and switching electromagnetic radiation will often be above such a range.

The problem of electromagnetic radiation is not new to designers of electronic equipment. However, semiconductor device manufacturers are challenged to provide effective EMI and RFI shielding for an over-molded semiconductor package without increasing the size of the package and without substantially increasing packaging cost.

In one approach, EMI and RFI shielding is provided by forming a discrete metal shield over the over-molded semiconductor package. The metal shield typically includes a wall, which is formed around the over-molded semiconductor package, and a cover, which is attached to the wall and situated a sufficient distance above the over-molded package to avoid interfering with the package. As a result, the metal shield undesirably increases the thickness of the final over-molded package. Also, the formation of the metal shield requires an extra process step and additional materials, which significantly increases packaging cost.

The resultant assembly of shield and component provides adequate shielding for many applications. However, as the frequency of chips increase (e.g., greater than 3 GHz) and the data transmission rates increase, the creation of errant EMI radiation becomes much more significant and more harmful to adjacent circuits and components. Indeed, with the increasing density of chips, the subject of immunity (of one chip relative to another) becomes all the more important. Thus, in general, conventional solutions will increasingly find themselves inadequate for purposes of immunity and indeed, radiated emissions, may also become an increasing issue. Moreover, for microwave devices, especially those that operate at harmonic frequencies above about 10 GHz., radiated emissions will be a significant concern.

In virtually all cases, the existing solutions are expensive and add to the cost of manufacturing electronic equipment such as cell phones, personal digital assistants, laptop computers, set-top boxes, cable modems, networking equipment including switches, bridges, and cross-connects. Moreover, as the density of electronic components on the printed circuit board increases, it may become difficult to find space on the printed circuit board to mount the EMI/RFI shields.

Thus, a need still remains for an integrated circuit package system for shielding electromagnetic interference. In view of the trend to produce higher frequency digital designs and shrinking package sizes, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including providing a substrate; coupling an integrated circuit to the substrate; mounting a shielding element around the integrated circuit; applying a conductive shielding layer on the shielding element; and coupling a system interconnect to the shielding element.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Figure 1:
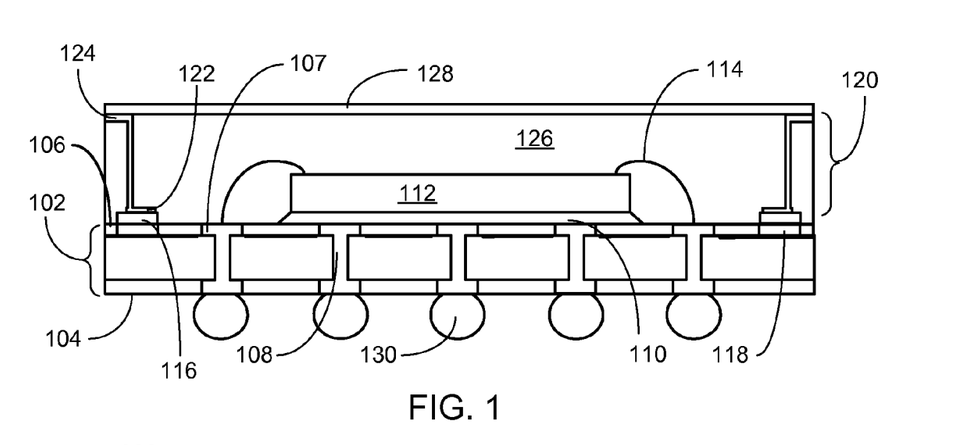
FIG. 1 is a cross-sectional view of an integrated circuit package system for shielding electromagnetic interference, in an embodiment of the present invention.

Referring now to FIG. 1, therein is shown a cross-sectional view of an integrated circuit package system 100 for shielding electromagnetic interference, in an embodiment of the present invention. The cross-sectional view of the integrated circuit package system 100 depicts a substrate 102, such as a printed circuit board or ceramic substrate, having a system side 104 and a component side 106. A bond pad 107 in combination with a via 108 may form a signal path from the component side 106 to the system side 104 of the substrate 102. The via 108 is displayed as going directly through the substrate 102, but it may actually utilize an intermediate layer (not shown) in the substrate 102 to form an indirect connection between the system side 104 and the component side 106. An adhesive 110, such as a die attach material, may adhere an integrated circuit 112 to the component side 106. The integrated circuit 112 may be a wire bond integrated circuit. Electrical interconnects 114 may couple the integrated circuit 112 to the bond pad 107.

A conductive adhesive 116 may be coupled to a pad 118, such as a ground pad or Vss pad. A shielding element 120, having a foot 122 and a contact 124, may be mounted on the conductive adhesive 116. An insulating compound 126 may be formed, on the component side 106, the integrated circuit 112, the electrical interconnects 114, and the shielding element 120, by molding. The insulating compound 126, such as an epoxy molding compound, may leave the top of the contact 124 exposed. A conductive shielding layer 128, such as a conductive resin, a metal, a conductive foil, or a conductive film, may be applied on the contact 124 and the insulating compound 126. The conductive shielding layer 128 may be applied by known methods, such as plating, sputtering, spraying, painting, rolling, or laminating.

The conductive adhesive 116, the shielding element 120, the conductive shielding layer 128 and the pad 118 may form a shield for electromagnetic interference when the integrated circuit 112 is mounted and operating. A Vss or Ground reference voltage may be coupled through a system interconnect 130, such as solder paste, a solder bump, a solder ball, a stud bump, or a solder column, coupled to the system side 104 of the substrate 102. Any electromagnetic interference may be blocked by the conductive shielding layer 128, the shielding element 120, the conductive adhesive 116, the pad 118, and the system interconnect 130 coupled to a ground reference on the next level system to which the integrated circuit package system 100 may be coupled.

It has been discovered that the integrated circuit package system 100 of the present invention provides an inexpensive and reliable shield for electromagnetic interference. The present invention does not add horizontal or vertical size to the integrated circuit package system 100 while providing a robust isolation barrier to electromagnetic interference.

Figure 2:
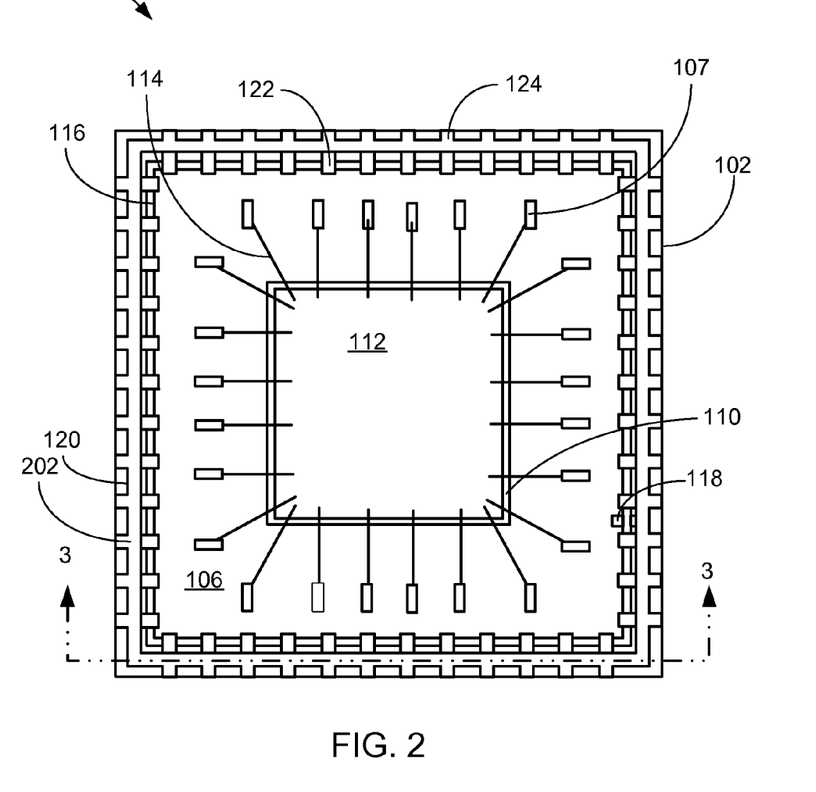
FIG. 2 is a top view of an integrated circuit package system in the shielding element installation phase of manufacturing.

Referring now to FIG. 2, therein is shown a top view of an integrated circuit package system 200 in the shielding element 120 installation phase of manufacturing. The top view of the integrated circuit package system 200 depicts the substrate 102 having the component side 106 and the bond pad 107. The adhesive 110 mounts the integrated circuit 112 to the component side 106 and the electrical interconnects 114 couple the integrated circuit 112 to the bond pad 107. The pad 118 may be electrically connected to the conductive adhesive 116, the foot 122, and the contact 124.

A tie bar 202 may link segments of the shielding element 120 for forming a square, a rectangle or some other geometric shape. It has been discovered that the shielding element 120 may be incorporated in a package having the integrated circuit 112 in a single configuration or in a system in package configuration where the integrated circuit 112 may be mounted with other electronic components. The section line 3-3 indicates the location and view for FIG. 3.

Figure 3:
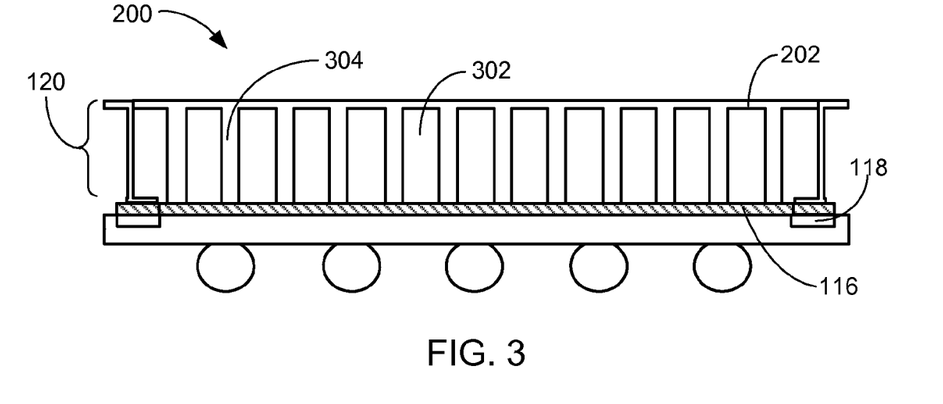
FIG. 3 is a cross-sectional view of the integrated circuit package system of FIG. 2 along the section line 3-3.

Referring now to FIG. 3, therein is shown a cross-sectional view of the integrated circuit package system 200 of FIG. 2 along the section line 3-3. The cross-sectional view of the integrated circuit package system 200 depicts the shielding element 120 having a rectangular opening 302 between shield element segments 304. The tie bar 202 joins the shield element segments 304 to form the rectangular opening 302. The rectangular opening 302 may allow the free flow of the insulating compound 126, of FIG. 1, during the molding process. The conductive adhesive 116 may couple the pad 118 to the shielding element 120.

This configuration is by way of an example. The rectangular opening 302 is shown as larger than the shield element segments 304, but either may be of any size and shape in order to isolate the integrated circuit 112, of FIG. 1, without increasing the finished package size.

Figure 4:
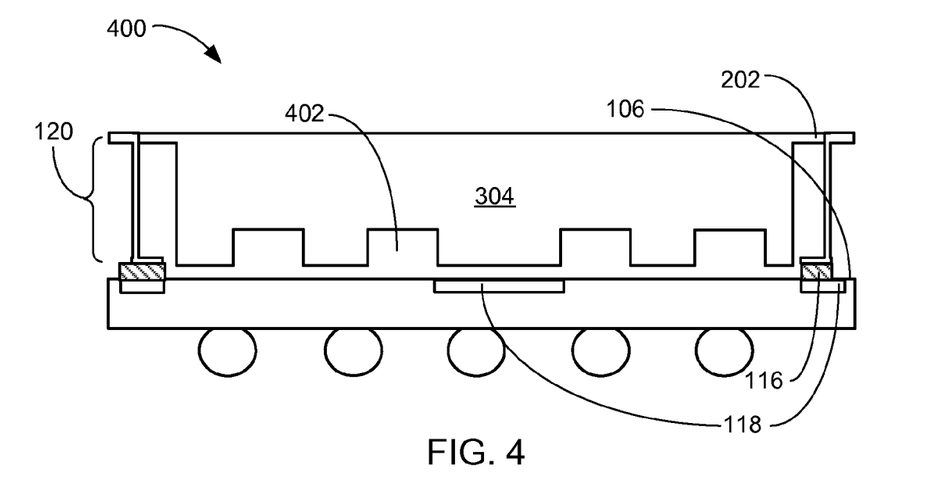
FIG. 4 is a cross-sectional view of an integrated circuit package system for shielding electromagnetic interference in an alternative embodiment of a shielding element.

Referring now to FIG. 4, therein is shown a cross-sectional view of an integrated circuit package system 400 for shielding electromagnetic interference in an alternative embodiment of the shielding element 120. The cross-sectional view of the integrated circuit package system 400 depicts the shielding element 120 having a short rectangular opening 402. The short rectangular opening 402 may be shorter in height than the integrated circuit 112, of FIG. 1, when it is mounted on the component side 106. The tie bar 202 links the shield element segments 304 to form the geometric shape around the integrated circuit 112 of FIG. 1. The conductive adhesive 116 may couple the pad 118 to the shielding element 120.

The number and position of the short rectangular opening 402 is by way of an example. The position, number, and size of the short rectangular opening may be different. The shield element segment 304 may not reach the component side 106 thus providing an overhang option.

Figure 5:
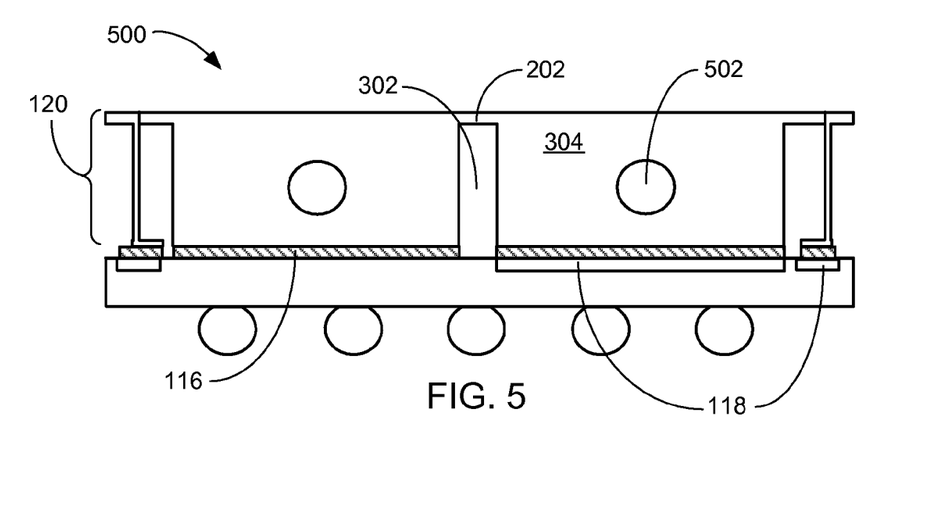
FIG. 5 is a cross-sectional view of an integrated circuit package system for shielding electromagnetic interference in another alternative embodiment of a shielding element.

Referring now to FIG. 5, therein is shown a cross-sectional view of an integrated circuit package system 500 for shielding electromagnetic interference in another alternative embodiment of the shielding element 120. The cross-sectional view of the integrated circuit package system 500 depicts the shielding element 120 having the rectangular opening 302 between the shield element segments 304 coupled by the tie bar 202.

A round opening 502 may be positioned on the shield element segment 304. The round opening 502 may allow the flowing of the insulating compound 126, of FIG. 1. The size, number, and position of the round opening 502 are by way of an example only. The number, size and position of the round opening 502 may be different. The round opening 502 is an example only and the actual shape of the opening may be different. The shield element segment 304 may be coupled to the pad 118 by the conductive adhesive 116.

Figure 6:
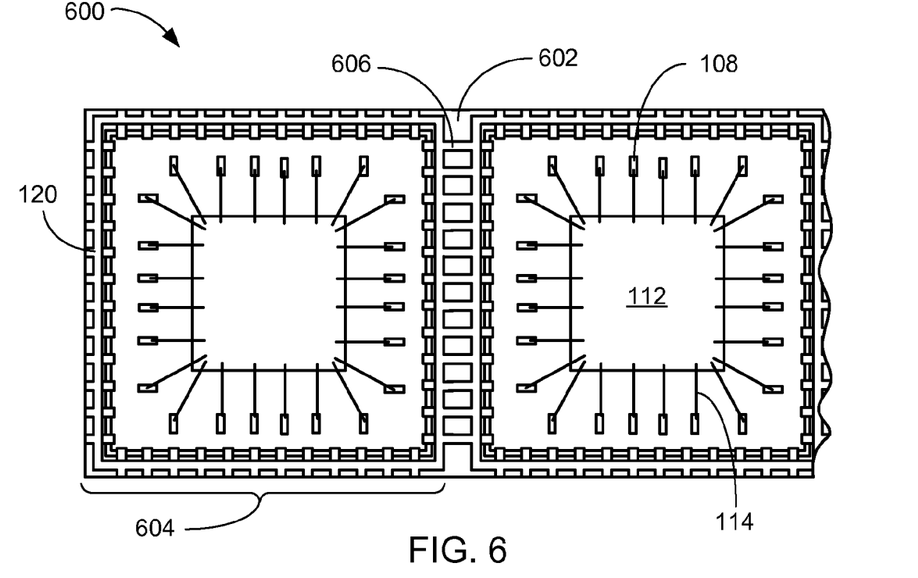
FIG. 6 is a top view of an integrated circuit package system in an assembly phase of manufacturing.

Referring now to FIG. 6, therein is shown a top view of an integrated circuit package system 600 in an assembly phase of manufacturing. The top view of the integrated circuit package system 600 depicts a strip substrate 602 for manufacturing the integrated circuit package system 600. Though the FIG. 6 shows only two locations for an assembly 604, this is for simplification and the actual number of assemblies 604 may be different.

A set of tie bars 606 may link the shielding elements 120 that are mounted on the strip substrate 602. The tie bars 606 also mark an area of singulation, used to divide the individual packages at the completion of manufacturing.

Each of the assemblies 604 may include the integrated circuit 112 and the electrical interconnects 114. Though the integrated circuit 112 is shown as a wire bond type, it may also be a flip chip type, or a combination thereof. The strip substrate 602 may have the vias 108 distributed to accommodate the type of the integrated circuit 112 mounted in the assembly 604. The shielding element 120 may be electrically connected to the strip substrate 602 as described in FIG. 2.

Figure 7:
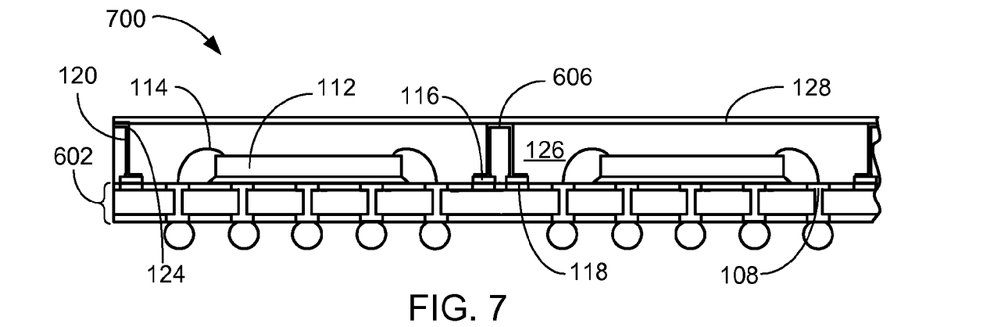
FIG. 7 is a cross-sectional view of an integrated circuit package system, in the conductive shielding layer application phase of manufacturing.

Referring now to FIG. 7, therein is shown a cross-sectional view of an integrated circuit package system 700, in the conductive shielding layer 128 application phase of manufacturing. The cross-sectional view of the integrated circuit package system 700 depicts the strip substrate 602 having the integrated circuit 112 mounted thereon. The electrical interconnects 114 electrically connect the integrated circuit 112 to the bond pad 107. The shielding elements 120 may be mounted on the conductive adhesive 116 and electrically connected to the pad 118.

The insulating compound 126 may be formed on the strip substrate 602, the integrated circuit 112, the electrical interconnects 114, and the shielding element 120. The insulating compound 126 does not cover the contact 124, of the shielding element 120, or the tie bars 606. The conductive shielding layer 128 may be applied over the insulating compound 126, the contacts 124 and the tie bars 606. An electrical connection is formed between the conductive shielding layer 128, the contacts 124 and the tie bars 606.

Figure 8:
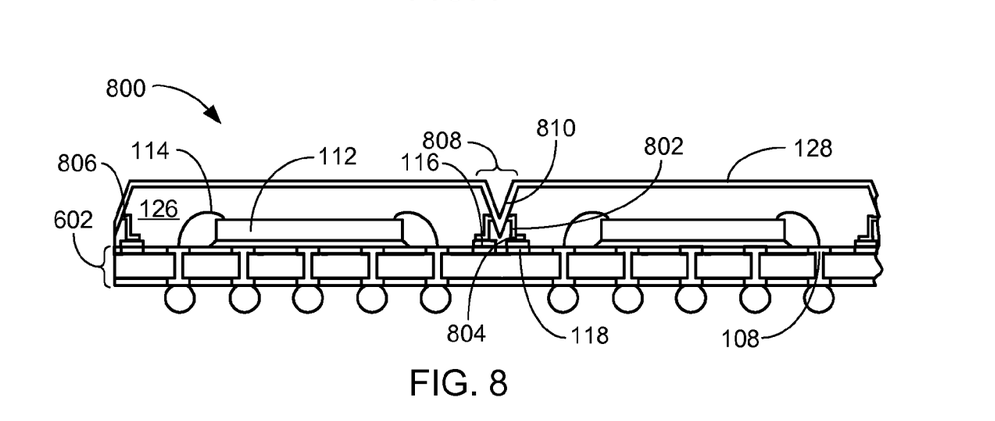
FIG. 8 is a cross-sectional view of an integrated circuit package system for shielding electromagnetic interference in an alternative embodiment of the present invention.

Referring now to FIG. 8, therein is shown a cross-sectional view of an integrated circuit package system 800 for shielding electromagnetic interference, in an alternative embodiment of the present invention. The cross-sectional view of the integrated circuit package system 800 depicts the strip substrate 602 having the integrated circuit 112 mounted thereon. The electrical interconnects 114 may couple the integrated circuit 112 to the strip substrate 602. A shielding element 802 may be coupled by placing a foot 804 on the conductive adhesive 116 which may be electrically connected to the pad 118.

The insulating compound 126 may be formed on the strip substrate 602, the integrated circuit 112, the electrical interconnects 114, and the shielding element 802. The insulating compound 126 may cover a contact 806, of the shielding element 802 and the tie bars 606, of FIG. 6. A groove 808, having a lateral side 810, may be formed in the insulating compound 126 by grinding or etching. The groove 808 may substantially remove the tie bars 606 and expose the contact 806 in preparation for the application of the conductive shielding layer 128. The conductive shielding layer 128 may be applied on the insulating compound 126, the contacts 806 and the groove 808.

It has been discovered that the shielding element 802 may have a vertical height that is shorter than the integrated circuit 112. This may allow the assembly of a very thin package while also providing a shield to electromagnetic interference and radio frequency interference.

Figure 9:
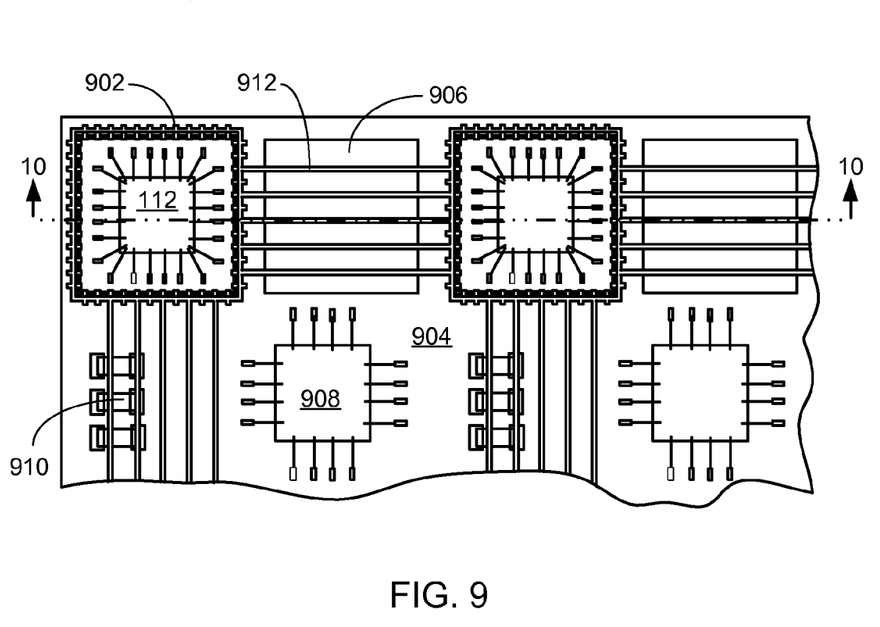
FIG. 9 is a top view of a system in package assembly in a shielding element installation phase of manufacturing.

Referring now to FIG. 9, therein is shown a top view of a system in package assembly 900 in a shielding element 902 installation phase of manufacturing. The top view of the system in package assembly 900 depicts the shielding element 902 having a structure and attach technique substantially similar to the shielding element 120 of FIG. 1. The integrated circuit 112 may be mounted within the shielding element 902.

A system in package substrate 904 may support several groups of components that will later be singulated to form individual system in package chips. A first system integrated circuit 906, such as a flip chip integrated circuit, may be mounted on the system in package substrate 904. A second system integrated circuit 908, such as a wire bond integrated circuit, may also be mounted on the system in package substrate 904. The system in package substrate 904 may indeed also have discrete components 910, such as resistors, capacitors, inductors, diodes, or the like, mounted thereon.

In order to isolate the integrated circuit 112 from electromagnetic interference generated by the first system integrated circuit 906, the second system integrated circuit 908, the discrete components 910, or a source outside the system in package substrate 904, the shielding element 902 may be coupled to reference voltage such as ground. It is also possible that the shielding element 902 may contain electromagnetic interference that might be generated by the integrated circuit 112 in order to protect the first system integrated circuit 906, the second system integrated circuit 908, and the discrete components 910. Tie bars 912 may form an array of the shielding element 902 by linking the individual structures together. A section line 10-10 may show the view of the system in package assembly 900 having been further processed.

Figure 10:
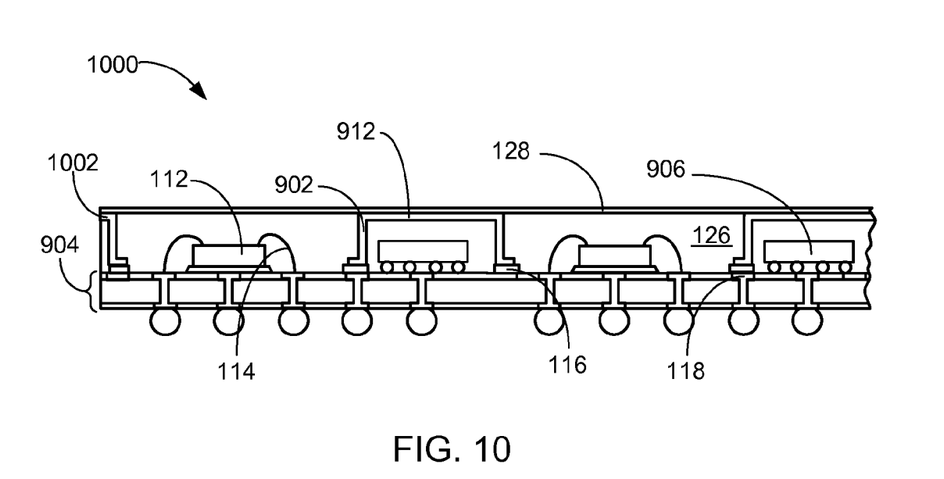
FIG. 10 is a cross-sectional view of the integrated circuit package system of FIG. 9 along the section line 10-10 in a pre-singulation phase of manufacture.

Referring now to FIG. 10, therein is shown a cross-sectional view of an integrated circuit package system 1000 of FIG. 9 along the section line 10-10 in a pre-singulation phase of manufacture. The cross-sectional view of the integrated circuit package system 1000 depicts the system in package substrate 904 having the integrated circuit 112 and the first system integrated circuit 906 mounted thereon. The shielding element 902 may be coupled to the system in package substrate 904 by the conductive adhesive 116.

The insulating compound 126 may be formed on the system in package substrate 904, the integrated circuit 112, the electrical interconnects 114, the first system integrated circuit 906, and the shielding element 902. The insulating compound 126 does not cover a contact 1002, of the shielding element 902, or the tie bars 912. The conductive shielding layer 128 may be applied over the insulating compound 126, the contacts 1002 and the tie bars 912. An electrical connection is formed between the conductive shielding layer 128, the contacts 1002 and the tie bars 912.

It has been discovered that the integrated circuit package system 1000, of the present invention, may provide an isolation from electromagnetic interference within the system in package by enclosing the integrated circuits 112, to be isolated. The integrated circuit package system 1000 may block the coupling of electromagnetic interference by providing a conductive shell comprised of the conductive adhesive 116, which may be electrically connected to the pad 118, the shielding element 902, and the conductive shielding layer 128. The pad 118 may be coupled to a voltage, such as ground or Vss.

Figure 11:
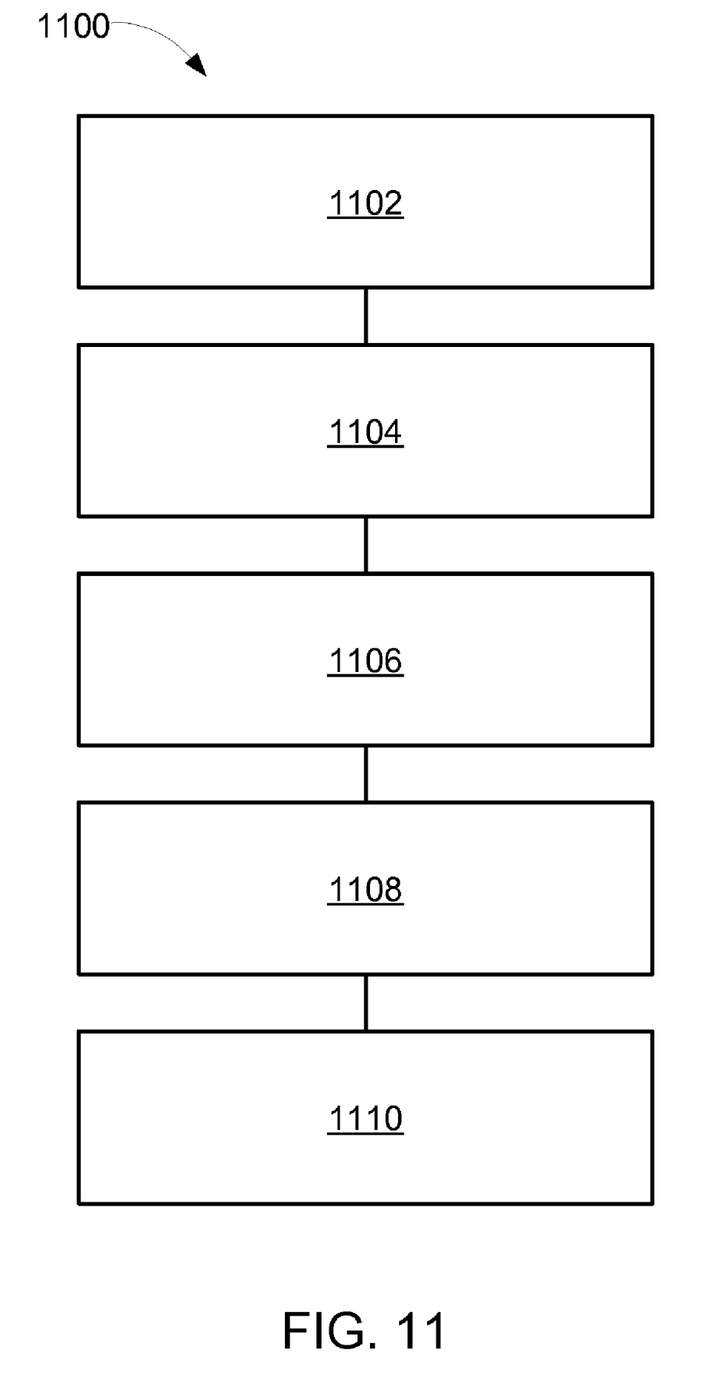
FIG. 11 is a flow chart of an integrated circuit package system for executing the integrated circuit package system for shielding electromagnetic interference in an embodiment of the present invention.

Referring now to FIG. 11, therein is shown a flow chart of an integrated circuit package system 1100 for executing the integrated circuit package system 100 for shielding electromagnetic interference in an embodiment of the present invention. The system 1100 includes providing a substrate in a block 1102; coupling an integrated circuit to the substrate in a block 1104; mounting a shielding element around the integrated circuit in a block 1106; applying a conductive shielding layer on the shielding element in a block 1108; and coupling a system interconnect to the shielding element in a block 1110.

It has been discovered that the present invention thus has numerous aspects.

A principle aspect that has been unexpectedly discovered is that the present invention provides an inexpensive and reliable shield for electromagnetic interference while it does not add horizontal or vertical size to the integrated circuit package.

Another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for shielding integrated circuits from electromagnetic interference and radio frequency interference. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   providing a substrate;
   coupling an integrated circuit to the substrate;
   mounting a shielding element having segments around the integrated circuit;
   linking a tie bar to a segment and another segment of the segments of the shielding element;
   applying a conductive shielding layer on the shielding element; and
   coupling a system interconnect to the shielding element.

2. The method as claimed in claim 1 further comprising applying a conductive adhesive between the shielding element and the substrate.

3. The method as claimed in claim 1 wherein coupling the system interconnect includes:
   electrically connecting a pad to the shielding element;
   coupling a via to the pad; and
   attaching the system interconnect to the pad.

4. The method as claimed in claim 1 further comprising molding an insulating compound on the substrate, the integrated circuit, and the shielding element including leaving a contact exposed.

5. The method as claimed in claim 1 further comprising forming a shield element segment, having an opening, including linking a tie bar between the shield element segments for forming the shielding element.

6. A method of manufacture of an integrated circuit package system comprising:
   providing a substrate including providing a strip substrate or a system in package substrate;
   coupling an integrated circuit to the substrate including coupling a wire bond integrated circuit, a flip chip integrated circuit, or a combination thereof;
   mounting a shielding element having segments around the integrated circuit including adhering the shielding element to the substrate;
   linking a tie bar to a segment and another segment of the shielding element;
   applying a conductive shielding layer on the shielding element including applying the conductive shielding layer over the integrated circuit; and
   coupling a system interconnect to the shielding element including coupling the conductive shielding layer.

7. The method as claimed in claim 6 further comprising applying a conductive adhesive between the shielding element and the substrate including electrically connecting a pad in the substrate to the shielding element.

8. The method as claimed in claim 6 wherein coupling the system interconnect includes:
   electrically connecting a pad to the shielding element;
   coupling a via to the pad including accessing the pad on a component side and a system side of the substrate;
   forming the system interconnect on the via including forming solder paste, a solder ball, a solder bump, a solder column, or a stud bump; and attaching the system interconnect including linking the via, the pad, the shielding element, and conductive shielding layer.

9. The method as claimed in claim 6 further comprising molding an insulating compound on the substrate, the integrated circuit, and the shielding element including leaving a contact exposed including forming a groove, having a lateral side, for exposing the contact.

10. The method as claimed in claim 6 further comprising forming a shield element segment, having an opening, including linking the tie bar between the shield element segments for forming the shielding element in which having the opening may include forming a rectangular opening, a short rectangular opening, or a round opening.

11. An integrated circuit package system comprising:
a substrate;
an integrated circuit coupled to the substrate;
a shielding element having segments around the integrated circuit;
a tie bar linking a segment and another segment of the shielding element;
a conductive shielding layer on the shielding element; and
a system interconnect coupled to the shielding element.

12. The system as claimed in claim 11 further comprising a conductive adhesive between the shielding element and the substrate.

13. The system as claimed in claim 11 wherein the system interconnect coupled includes:
a pad electrically connected to the shielding element;
a via coupled to the pad; and
the system interconnect attached to the pad.

14. The system as claimed in claim 11 further comprising an insulating compound molded on the substrate, the integrated circuit, and the shielding element with a contact exposed.

15. The system as claimed in claim 11 further comprising a shield element segment, having an opening, with a tie bar between the shield element segments for forming the shielding element.

16. The system as claimed in claim 11 further comprising:
a strip substrate or a system in package substrate;
a wire bond integrated circuit, a flip chip integrated circuit, or a combination thereof coupled to the substrate; and
wherein:
the conductive shielding layer applied over the integrated circuit; and
the conductive shielding layer and the shielding element coupled to the system interconnect.

17. The system as claimed in claim 16 further comprising a conductive adhesive between the shielding element and the substrate includes a pad in the substrate electrically connected to the shielding element.

18. The system as claimed in claim 16 wherein the system interconnect coupled includes:
a pad electrically connected to the shielding element;
a via coupled to the pad including the pad accessed on a component side, a system side of the substrate, or both; and
the system interconnect on the via includes solder paste, a solder ball, a solder bump, a solder column, or a stud bump attached to the via.

19. The system as claimed in claim 16 further comprising an insulating compound molded on the substrate, the integrated circuit, and the shielding element includes a contact left exposed including a lateral side, for exposing the contact.

20. The system as claimed in claim 16 further comprising a shield element segment with an opening, includes the tie bar between the shield element segments for forming the shielding element in which the opening may include a rectangular opening, a short rectangular opening, or a round opening.

* * * * *